(12) United States Patent
Nakamura

(10) Patent No.: US 10,242,132 B2
(45) Date of Patent: Mar. 26, 2019

(54) PRODUCTION SYSTEM SIMULATION DEVICE, PRODUCTION SYSTEM SIMULATION METHOD, AND PRODUCTION SYSTEM SIMULATION PROGRAM

(71) Applicant: LEXER RESEARCH INC., Tottori-shi, Tottori (JP)

(72) Inventor: Masahiro Nakamura, Tottori (JP)

(73) Assignee: LEXER RESEARCH INC., Tottori-shi (JP)

( * ) Notice: Subject to any disclaimer, the term of this patent is extended or adjusted under 35 U.S.C. 154(b) by 405 days.

(21) Appl. No.: 14/912,330

(22) PCT Filed: Aug. 25, 2014

(86) PCT No.: PCT/JP2014/004355
§ 371 (c)(1),
(2) Date: Feb. 16, 2016

(87) PCT Pub. No.: WO2015/033531
PCT Pub. Date: Mar. 12, 2015

(65) Prior Publication Data
US 2016/0196371 A1    Jul. 7, 2016

(30) Foreign Application Priority Data

Sep. 3, 2013 (JP) ................................ 2013-182592

(51) Int. Cl.
*G06G 7/48* (2006.01)
*G06F 17/50* (2006.01)
*G06Q 10/06* (2012.01)

(52) U.S. Cl.
CPC ......... *G06F 17/5009* (2013.01); *G06Q 10/06* (2013.01)

(58) Field of Classification Search
None
See application file for complete search history.

(56) References Cited

U.S. PATENT DOCUMENTS 6,983,232 B2 * 1/2006 Nguyen ........... G05B 19/41885
700/121
2004/0153868 A1 * 8/2004 Nonaka ............ G05B 19/41805
714/47.2

FOREIGN PATENT DOCUMENTS

JP       2-83146 A       3/1990
JP       2-130678 A      5/1990
(Continued)

OTHER PUBLICATIONS

International Search Report dated Nov. 4, 2014, issued in counterpart application No. PCT/JP2014/004355 (2 pages).

*Primary Examiner* — Cedric Johnson
(74) *Attorney, Agent, or Firm* — Westerman, Hattori, Daniels & Adrian, LLP

(57) ABSTRACT

The production system simulation device includes: a facility element information storage portion that stores various factors for facility elements as facility element information, an operation element information storage portion that stores operation element information which includes development conditions of operation elements and an output destination after the completion of an operation, and a link information storage portion that stores link information of the facility elements and the operation elements, wherein according to sufficiency of development conditions of operation element information of a first operation element linked by the link information to a first facility element, the first facility element performs the operation, an output of the operation is output to the output destination after the completion of the operation in the operation element information of the first operation element and thus processing is simulatively performed.

13 Claims, 8 Drawing Sheets

(56) References Cited

FOREIGN PATENT DOCUMENTS

| | | | | |
|---|---|---|---|---|
| JP | H02130678 | A | * | 5/1990 |
| JP | 5-143612 | A | | 6/1993 |
| JP | 2000-202742 | A | | 7/2000 |
| JP | 2000202742 | A | * | 7/2000 |
| JP | 2001-344008 | A | | 12/2001 |
| JP | 2005-100092 | | | 4/2005 |

* cited by examiner

Fig. 2
(a)
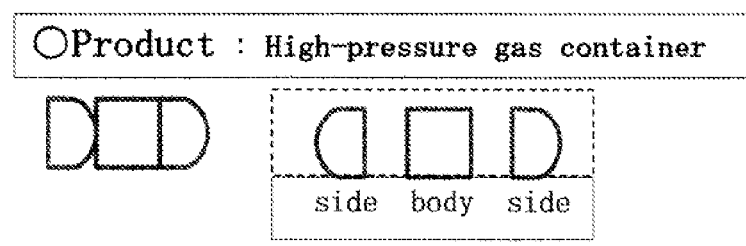
(b)
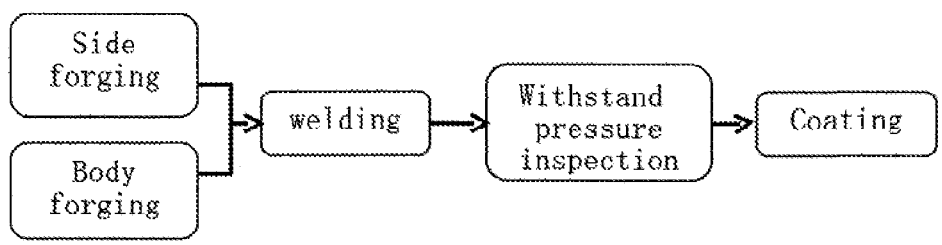

Fig.4

| Facility element | CT [min] | Position coordinate | Size | Storage possible amount | Present Storage amount | Additional condition | ... |
|---|---|---|---|---|---|---|---|
| Facility element A | --- | Xa, Ya | Sxa, Sya | VMa | VCa | One worker | |
| Facility element B | --- | Xb, Yb | Sxb, Syb | VMb | VCb | One worker | |
| Facility element C | --- | Xc, Yc | Sxc, Syc | VMc | VCc | Two workers | |
| Facility element D | 12.0 | Xd, Yd | Sxd, Syd | VMd | VCd | One worker | |
| Facility element E | --- | Xe, Ye | Sxe, Sye | VMe | VCe | One worker | |
| Facility element F | --- | Xf, Yf | Sxf, Syf | VMf | VCf | One worker | |
| Facility element G | 18.0 | Xg, Yg | Sxg, Syg | VMg | VCg | One worker | |
| Facility element H | --- | Xh, Yh | Sxh, Syh | VMh | VCh | One worker | |

Fig.5

| Operation element | Development condition | | Output destination | CT [min] | Types and numbers of output products | ... |
|---|---|---|---|---|---|---|
| | Types and numbers of necessary components | | | | | |
| Operation element WE1 | No condition | | Operation element WE3 | 7.0 | One component we1 | |
| Operation element WE2 | No condition | | Operation element WE3 | 4.0 | One component we2 | |
| Operation element WE3 | One component we1 Two components we2 | | Operation element WE4 | 16.0 | One component we3 | |
| Operation element WE4 | One component we3 | | Operation element WE5 | 16.0 | One component we4 | |
| Operation element WE5 | One component we4 | | Buffer | 10.0 | One component we5 | |

Fig.6

| Operation element | Facility element |
|---|---|
| Operation element WE1 | Facility element C |
| Operation element WE2 | Facility element A |
| Operation element WE3 | Facility element D |
| | Facility element E |
| Operation element WE4 | Facility element G |
| Operation element WE5 | Facility element H |

PRODUCTION SYSTEM SIMULATION DEVICE, PRODUCTION SYSTEM SIMULATION METHOD, AND PRODUCTION SYSTEM SIMULATION PROGRAM

TECHNICAL FIELD

The present invention relates to a production system simulation device, a production system simulation method and a production system simulation program that predict state progress in, for example, a system which is formed with elements such as products, machines, workers and transport means such as a transport worker and a forklift related to logistics in, for example, the operation steps of production in the manufacturing industry.

BACKGROUND ART

In recent years, in production factories, the degree of manufacturing of a wide variety of products in small quantities in which a large number of products are manufactured according to a variety of market demands has been increased, and in one production line, a plurality of production items often need to be produced. In a case where a wide variety of products are manufactured on the same production line in a mixed manner, the numbers of components, processing methods and assembly methods are different when the products to be produced are different, and operation times necessary in individual steps differ when the number of steps in a production line differs, producing a problem that does not occur in the production of a single product.

For example, when a wide variety of products are manufactured on the same production line, various types of waste are produced. Specifically, when operation times necessary in individual steps differ depending on products, variations in the operation times of the individual steps are produced which produces standby times in the individual steps. In order to manufacture different products, it is necessary to perform a so-called stage replacement such as the change of jigs. Although it is necessary to timely supply necessary components to necessary steps according to the production plan of each product in the logistics of a factory, when a wide variety of products are manufactured, the supply of components becomes complicated.

Conventionally, in order to cope with such a problem, the analysis of effects of simulation technology in a production line has been utilized. The simulation of a production line is performed by a technology that is generally referred to as discrete simulation. In this discrete simulation, software is used to set facility elements of products, machines, workers and transport means such as forklifts; and operations developed by the facility elements and conditions for the development. The relationship of the development thereof is then evaluated and the behavior of the production line is predicted (see patent literature 1).

Specifically, specific operations developed by the facility elements, conditions for developing the specific operations of the facility elements, and various factors such as operation times of the specific operations and required amounts such as the number of necessary components are set for each facility element, and other facility elements are set as output destinations to which information that the specific operations are completed is notified when the specific operations are completed. A setting is then made such that the specific operations of the other facility elements are developed according to the output of the specific operations. In other words, the facility elements are networked and defined.

The specific operations are developed on the facility elements serving as the root of the production process network, thereby propagating the development of the specific operations to the facility elements of the production process network extended to the root and proceeding computation of the simulation and simulating a state where the production on the production line proceeds. By recording the start time and the completion time of the specific operations of the facility elements and the number of components consumed in this simulation, the time progress of an operation time ratio in the facility elements and the time progress of the number of components consumed can be predicted, and the total time (lead time) needed for the production of one product, the state of component supply logistics such as whether or not components prepared in a component warehouse or a component rack are missing and the time at which they went missing and the like can be predicted, with the result that it is possible to analyze problems in a production line before the start of mass production.

CITATION LIST

Patent Literature

Patent Literature 1: Japanese Unexamined Patent Application Publication No. 2000-202742

SUMMARY OF INVENTION

Technical Problem

Incidentally, in the simulation technology described above, the production process network is described by defining the individual facility elements. By setting the development conditions of the specific operations for each facility element, the various factors such as the operation times of the facility elements and the number of necessary components, and the other facility elements of the output destinations to which information that the specific operations are completed is notified, it is possible to set the simulation of the production line and thus design software. However, since it is necessary to set the conditions of the facility elements under the assumption of a facility element which performs a specific operation forming the production process, it is important to assume in which one of the facility elements the specific operation is to be performed.

Here, when the facility element that performs the operation needs to be changed to the other facility element and not to the assumed facility element, a problem occurs. Specifically, when as a result of the simulation of the production line, for example, it is preferable to change to the other facility element and not to the assumed facility element, or when it is necessary to additionally introduce a new facility element, it is necessary to change and set the description of the development conditions for the facility elements. However, since the development conditions of facility elements are merely the development conditions of such facility elements, it is necessary to perform an operation of producing, correcting and defining development conditions for the facility elements after being changed while separately assuming an operation in the flow of the operation of the entire product. In particular, when a large number of facility elements are changed, an operation of describing and correcting the program thereof is very large.

Furthermore, the description of the development conditions to be corrected is generally performed one at a time for facility elements such as production facilities using a conditional formula format such as "if . . . then . . . else . . . " in a program and is not intuitive but specialized to setting operations, with the result that it is difficult for engineers other than those with specialized knowledge to perform the task.

Furthermore, disadvantageously, since it is common for even an engineer who has received special training to require a few months to prepare for, for example, grasping the production line, an operating cost for performing the simulation is increased, and the evaluation of the design of the production line is delayed by a long preparation time.

The present invention is proposed in view of the foregoing problems, and an object of the present invention is to provide a production system simulation device, a production system simulation method and a production system simulation program that can easily and flexibly set and change a facility element which performs an operation and that can seek a variety of simulations and optimum process conditions at low cost and in a rapid manner.

Solution to Problem

According to the present invention, there is provided a production system simulation device that simulates state progress caused by a chain of phenomena generated discretely, the production system simulation device including: a facility element information storage portion that stores various factors for facility elements as facility element information; an operation element information storage portion that stores operation element information which includes development conditions of operation elements and an output destination after completion of an operation; and a link information storage portion that stores link information of the facility elements and the operation elements, where according to sufficiency of development conditions of operation element information of a first operation element linked by the link information to at least a first facility element, the first facility element performs the operation, an output of the operation is output to the output destination after the completion of the operation in the operation element information of the first operation element and thus processing is simulatively performed.

In this way, regardless of the ability and number of the facility elements, the unchanged operation element information of the operation elements can be set independently of the facility element information, and the simulation can be performed by setting a desired link, with the result that it is possible to easily and flexibly set and change the facility element which performs the operation and that it is possible to seek a variety of simulations and optimum process conditions at low cost and in a rapid manner.

In the production system simulation device according to the present invention, as the various factors for the facility elements, position information of the facility elements is stored in the facility element information storage portion, a transport time from the first facility element to a second facility element based on position information of the first facility element and position information of the second facility element as an output destination of the first facility element is acquired and at a time when the transport time has elapsed since an operation completion time of the first facility element, an intermediate product after the completion of the operation of the first facility element is output to the second facility element and thus the processing is simulatively performed.

In this way, it is possible to obtain the result of the simulation in a more accurate process to which the transport time is added.

In the production system simulation device according to the present invention, as development conditions of the operation element information of the first operation element, types and numbers of necessary components are set, the first facility element linked to the first operation element generates a generated product so as to consume the components, and types and numbers of the generated product are output to the output destination, and when a cycle time is set as the facility element information of the first facility element in addition to a standard cycle time set as the operation element information of the first operation element, an operation of generating the generated product is performed using the cycle time of the facility element information and thus the processing is simulatively performed.

In this way, the types and numbers of necessary components set in the operation element information are flexibly used in the desired facility element, and thus it is possible to perform simulation of the manufacturing operation. In a plurality of types of facility elements, as generically available operation element information, the standard cycle time can be set to the operation element and, for example, when a specific facility element has a short cycle time in a high-functionality production machine, it is possible to reflect the property of the specific facility element on the simulation.

The production system simulation device according to the present invention, the result of the simulation can be transmitted to a client terminal through a communication line either directly or indirectly.

In this way, it is possible to submit the result of the simulation of the production system simulation device to a user who is in another site such as a remote place. The user can obtain the analysis of effects by the simulation of the production system simulation device shared by a plurality of users only when it is needed, with the result that it is possible to efficiently utilize the production system simulation device and to perform analysis of effects by the simulation at a lower cost.

A client terminal of the present invention can receive the result of the simulation from the production system simulation device of the present invention through the communication line either directly or indirectly.

In this way, it is possible to submit the result of the simulation of the production system simulation device to a user who is in another site such as a remote place. The user can obtain the analysis of effects by the simulation of the production system simulation device shared by a plurality of users only when it is needed, with the result that it is possible to efficiently utilize the production system simulation device and to perform analysis of effects by the simulation at a lower cost.

According to the present invention, there is provided a production system simulation method of simulating state progress caused by a chain of phenomena generated discretely, where based on facility element information of various factors for facility elements, operation element information including development conditions of operation elements and an output destination after completion of an operation and link information of the facility elements and the operation elements that are stored in a storage portion, according to sufficiency of development conditions of operation element information of a first operation element linked by the link information to at least a first facility element, the first facility element performs the operation, an output of the operation is output to the output destination after the completion of the operation in the operation element information of the first operation element and thus processing is simulatively performed.

In this way, regardless of the ability and number of the facility elements, the unchanged operation element information of the operation elements can be set independently of the facility element information, and the simulation can be performed by setting a desired link, with the result that it is possible to easily and flexibly set and change the facility element which performs the operation according to the facility held by the factory performing the production and that it is possible to seek a variety of simulations and optimum process conditions at low cost and in a rapid manner.

According to the present invention, there is provided a production system simulation program that makes a computer function as a means of simulating state progress caused by a chain of phenomena generated discretely, where the computer is made to function as a means of storing various factors for facility elements as facility element information; a means of storing operation element information which includes development conditions of operation elements and an output destination after completion of an operation; and a means of storing link information of the facility elements and the operation elements and a means in which, according to sufficiency of development conditions of operation element information of a first operation element linked by the link information to at least a first facility element, the first facility element performs the operation, an output of the operation is output to the output destination after the completion of the operation in the operation element information of the first operation element and thus processing is simulatively performed.

In this way, regardless of the ability and number of the facility elements, the unchanged operation element information of the operation elements can be set independently of the facility element information, and the simulation can be performed by setting a desired link, with the result that it is possible to easily and flexibly set and change the facility element which performs the operation according to the facility held by the factory performing the production, and that it is possible to seek a variety of simulations and optimum process conditions at low cost and in a rapid manner.

Advantageous Effects of Invention

In the present invention, it is possible to easily and flexibly set and change a facility element which performs an operation and to seek a variety of simulations and optimum process conditions at low cost and in a rapid manner.

BRIEF DESCRIPTION OF DRAWINGS

FIG. 2(a) is an illustrative diagram showing a product example in an example, and FIG. 2(b) is an illustrative diagram showing the flow of a production process in the example;

FIG. 4 is a diagram showing an example of facility element information in the example;

FIG. 5 is a diagram showing an example of operation element information in the example;

FIG. 6 is a diagram showing an example of link information in the example;

DESCRIPTION OF EMBODIMENTS

[Production System Simulation Device of Embodiment]

Figure 1:
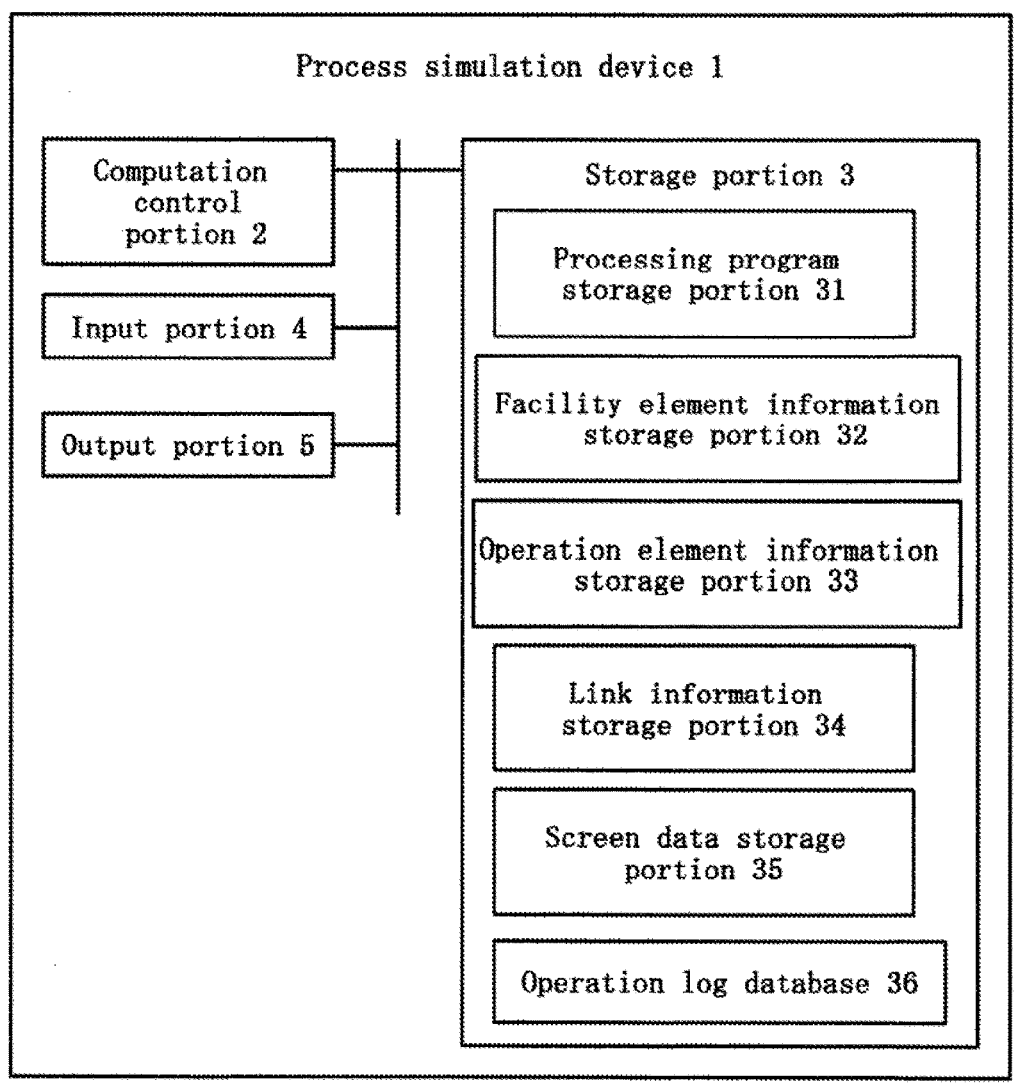
FIG. 1 is a block diagram showing the overall configuration of a production system simulation device according to an embodiment.

A production system simulation device 1 of an embodiment of the present invention is a device that simulates the state progress of a process caused by a chain of phenomena generated discretely, and includes, as shown in FIG. 1, a computation control portion 2 such as a CPU, a storage portion 3 that is formed with a ROM, a hard disk and the like, an input portion 4 such as a mouse, a keyboard or a touch panel, and an output portion 5 such as a display or a printer.

The storage portion 3 includes a processing program storage portion 31 that stores a processing program such as a production system simulation program which makes the computation control portion 2 perform predetermined processing, a facility element information storage portion 32 that stores various factors for the facility elements as facility element information, an operation element information storage portion 33 that stores operation element information including the development conditions of the operation elements and output destinations after the completion of the operation, a link information storage portion 34 that stores link information of the facility elements and the operation elements, a screen data storage portion 35 that stores data on a predetermined screen displayed on the display of the output portion 5 and an operation log database 36 that stores the operation log of a change of the state in the facility elements according to the time. The storage portion 3 further includes a region that stores data necessary for performing predetermined processing of the discrete simulation.

As the various factors for the facility elements set as the facility element information, it is possible to set appropriate various factors caused by or related to the facility elements themselves and, for example, various factors such as the cycle times of the production facility elements and position information are set.

As the operation element information, appropriate various factors that are information which does not depend on the facility elements and that are related to specific operations are set, and as various factors related to an operation of producing a specific product, the number of necessary components serving as the development conditions of the operation elements, output destinations after the completion of the operation, the number of components which are output, and the like are set. In an entire process such as an entire production process, for example, some pieces of operation element information of the operation elements where the development conditions are not set and stored such as a piece of information in which, in the operation element of the first step, one corresponding to the development conditions is a start input may be included in the operation element information of the entire operation elements.

The link information of the facility elements and the operation elements stored in the link information storage portion 34 is set as follows: by the control of the computation control portion 2 cooperating with the production system simulation program, a predetermined setting screen is displayed on the display of the output portion 5, and the setting is made according to the input from the input portion 4 on the setting screen. However, preferably, a screen in which the facility elements are two-dimensionally arranged and a screen in which the operation elements forming the production process network are arranged as a network are displayed, and the elements of the two screens are selected and are associated by the execution of an association command or drag and drop or the like and thus the link information can be input and set, with the result that the link setting is intuitive and easy to use.

The computation control portion 2 of the production system simulation device 1 includes a means for simulatively performing computation processing on the state progress of the production process caused by the chain of phenomena generated discretely, and is the same in this regard as a simulation device of a production process that performs an existing discrete simulation.

However, in the discrete simulation of the existing production process, the development conditions and the output destinations after the completion of the operation are fixed and set as the facility element information of the facility elements, and the operation of the facility elements is developed according to the sufficiency of the development conditions serving as the facility element information, an intermediate product after the completion of the operation is output to the output destinations of the facility element information, and the computation proceeds. By contrast, in the computation control portion 2 of the production system simulation device 1 of the present embodiment, the development conditions and the output destinations after the completion of the operation are set as the operation element information of the operation elements, the operation of the facility elements is developed such that the operation in which the facility elements are specified by the operation element information of the operation elements is performed according to the sufficiency of the development conditions of the operation element information of the operation elements linked with the facility elements by the link information, and an intermediate product after the completion of the operation is output to the output destinations of the operation element information, and the computation proceeds.

In the computation of the computation control portion 2, for example in the process of computation, the development conditions and the output destinations of the operation element information of the operation elements linked to the facility elements are referenced, and the computation can be performed such that the operation of the facility elements is developed and output according to the sufficiency of the development conditions. Alternatively, before the computation, the development conditions and the output destinations of the operation element information of the operation elements linked to the facility elements are stored as additional information of the facility elements in the storage portion 3, and the computation can be performed such that the operation of the facility elements is developed and output according to the sufficiency of the development conditions of the operation element information serving as the additional information. In the latter example, before the computation, the development conditions and the output destinations are added to the facility elements, and thus it is not necessary to perform processing for acquisition of the link information in the process of the computation, with the result that it is possible to reduce the amount of processing performed by the computation control portion 2.

Furthermore, preferably, as the various factors for the facility elements, the position information of the facility elements is stored in the facility element information storage portion 32, in the computation processing of the computation control portion 2, a transport time from a first facility element to a second facility element based on the position information of the first facility element and the position information of the second facility element serving as the output destination of the first facility element is acquired and at a time when the transport time has elapsed since the operation completion time of the first facility element, the processing is performed simulatively such that the intermediate product after the completion of the operation of the first facility element is output to the second facility element, with the result that it is possible to obtain the result of the simulation of a more accurate process to which the transport time is added.

The acquisition of the transport time can be performed, for example, by storing, in a predetermined region of the storage portion 3, a coordinate system specifying the entire area of a production factory or the like and a setting speed, and computing and acquiring in the computation processing of the computation control portion 2 the transport time from the position information of the first facility element, the position information of the second facility element and the setting speed, or by utilizing an existing path estimation technology, using predetermined data stored in the predetermined region of the storage portion 3, estimating a movement path in the computation processing of the computation control portion 2 and computing and acquiring, based on the movement path, the transport time from the first facility element to the second facility element.

In the production system simulation device 1 of the present embodiment, regardless of the ability and number of the facility elements, the unchanged operation element information of the operation elements can be set independently of the facility element information, and a desired link can be dynamically set, coordinated and simulated, with the result that it is possible to easily and flexibly set and change the facility element which performs the operation and that it is possible to seek a variety of simulations and optimum process conditions at low cost and in a rapid manner.

For example, in order for the production ability of the facility elements within the factory to be set according to the number of mass productions in the production process, a number of facility elements necessary to cope with the production ability are prepared, and when the amount of production required is increased, a plurality of facility elements having the same function are arranged to increase the production ability. However, even when the number of facility elements is increased, the production process network formed with the operation elements for the production of the product is the same. Hence, regardless of the ability and number of the facility elements, the unchanged operation element information of the operation elements is set independently of the facility element information, and is coordinated according to the individual production plan, with the result that it is possible to realize flexible simulation and flexible factory operation.

When the number of products to be produced is reduced, in order for the operation rate of the production line to be increased, a product other than an original product is produced in the production line at the same time, and even in this case, since the facility element information and the operation element information are independent, it is possible to easily verify a variety of combinations and to determine the optimum combination and process conditions.

EXAMPLES

An example where the production system simulation device 1 of the embodiment is applied to a production process for manufacturing a high-pressure gas container as a product will be described next. As shown in FIG. 2, in the example, the high-pressure gas container is formed by adhering a main body (Body) to side portions (Side) on both sides, the main body (Body) and the side portions (Side) on both sides are individually forged, then the main body (Body) and the side portions (Side) on both sides are welded and thereafter coated after performing a withstand pressure inspection, with the result that the high-pressure gas container is completed in the production line.

Figure 3:
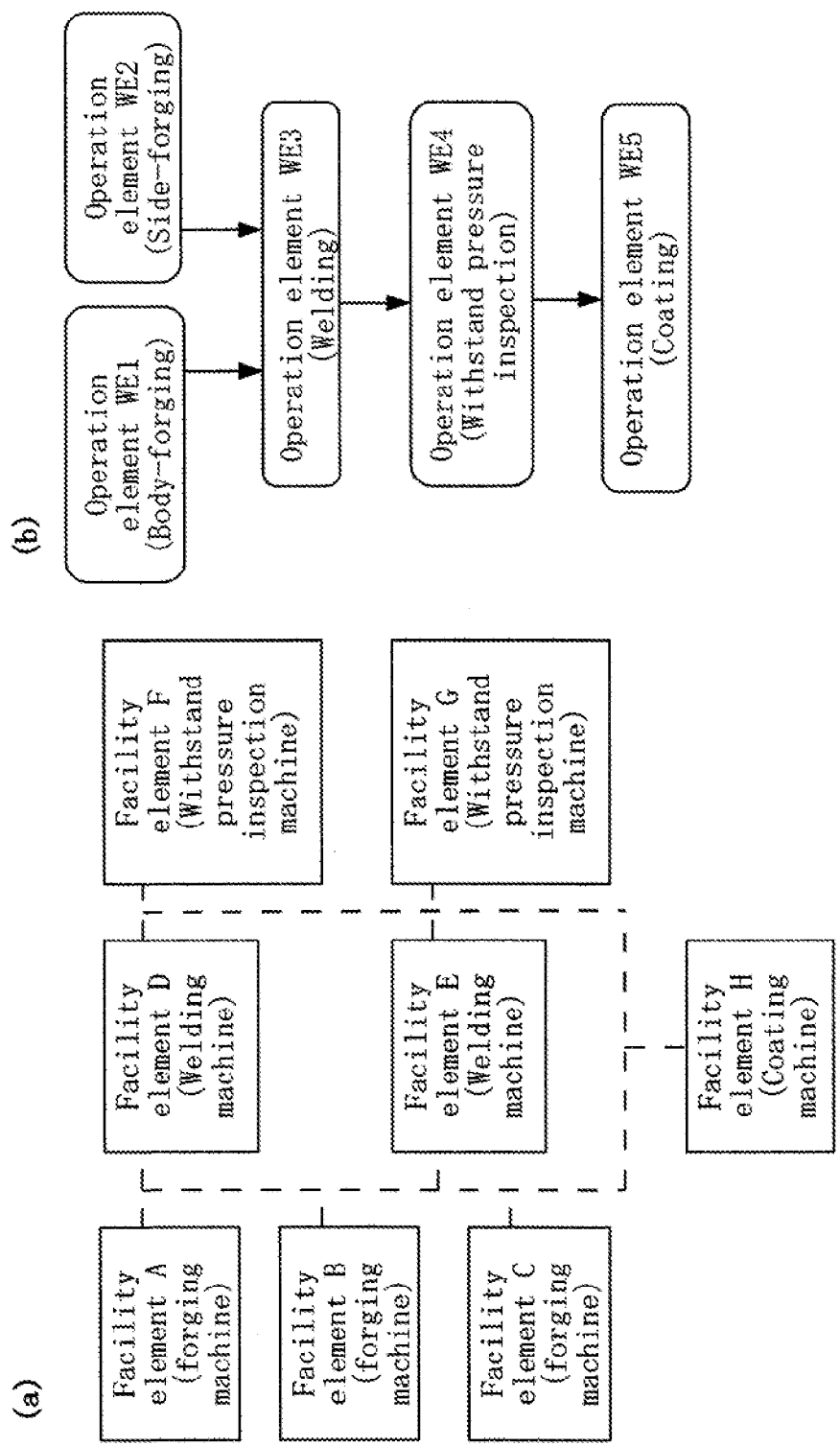
FIG. 3(a) is an illustrative diagram showing facility elements in the example.
FIG. 3(b) is a flowchart showing the flow of the production process of operation elements in the example.

In this production process, the facility elements and the operation elements are defined as shown in FIG. 3. Specifically, facility elements A to C are defined as forging machines, facility elements D and E are defined as welding machines, facility elements F and G are defined as withstand pressure inspection machines and a facility element H is defined as a coating machine. An operation element WE1 is defined as a main body (Body) forging step, an operation element WE2 is defined as a side (Side) forging step, an operation element WE3 is defined as a welding step, an operation element WE4 is defined as a withstand pressure inspection step and an operation element WE5 is defined as a coating step. FIG. 3 schematically shows the positions and the paths (indicted by the dotted lines of the figure) of stations serving as the facility elements in a factory layout.

For example, by an input from the input portion 4 or the like, for each of the facility elements, the facility element information serving as the various factors for the facility elements is stored in the facility element information storage portion 32 of the production system simulation device 1, and for each of the operation elements, the operation element information serving as the various factors for the operation elements is stored in the operation element information storage portion 33. Furthermore, the facility elements and the operation elements are associated with each other to associate the facility element information with the operation element information, and the link information of the association is stored in the link information storage portion 34.

FIG. 4 shows an example of the facility element information that is set as the facility elements. In this example, for the facility elements, the cycle time CT [min] for each product, position coordinates in the coordinate system of the factory layout, the vertical and lateral sizes occupied by the facility elements, the number of components of the component buffers of the facility elements capable of being accommodated, the number of components of the component buffers of the facility elements presently accommodated and the like are set as the facility element information. For example, when the facility elements require a plurality of types of other components, the number of component buffers capable of being accommodated and the number of component buffers presently accommodated are preferably set for each of the types of components.

FIG. 5 shows an example of the operation element information that is set as the operation elements. In this example, for the operation elements, as the development conditions, the types of necessary components and the number thereof, and the operation elements serving as the output destinations of the operation completion products of the operation elements are set as the operation element information. As output information, the standard cycle time and the types of the output products after the completion of the operation and the number thereof are set as the operation element information. The standard cycle time of the operation elements indicates the general cycle time of the operation, and when the operation elements are performed as the facility elements, in a case where the cycle time is desired to be changed by the characteristics of the facility elements, the cycle time of the facility element information is applied, with the result that the cycle time held in the facility element information described above is preferably utilized. In addition to the information described above, the following may be set as development conditions: jigs necessary for the operation, the amount of consumable products, the number of workers necessary for performing the operation and the secondary resources necessary for performing the operation such as electric power, hydraulic power and gas and furthermore, a flag in which, in order to also operate as post-process taking over (just-in-time inventory system), whether or not the operation is post-process taking over and in the case of post-process taking over, whether or not the present state is satisfactory for operation corresponding to the state of the post process. As the output information, the number of tools consumed and the number of chips discharged and the amounts of heat, water and gas may be set.

FIG. 6 shows an example of the link information. In this example, the operation element WE1 is set at the facility element C, the operation element WE2 is set at the facility element A, the operation element WE3 is set at the facility elements D and E, the operation element WE4 is set at the facility elements F and G and the operation element WE5 is set at the facility element H. However, the operation elements can be associated with the appropriate facility elements among the entire facility elements A to H within the factory, or the operation elements can be associated with the entire facility elements A to H within the factory, and this association can be flexibly set and changed according to, for example, the amount of necessary production.

Figure 7:
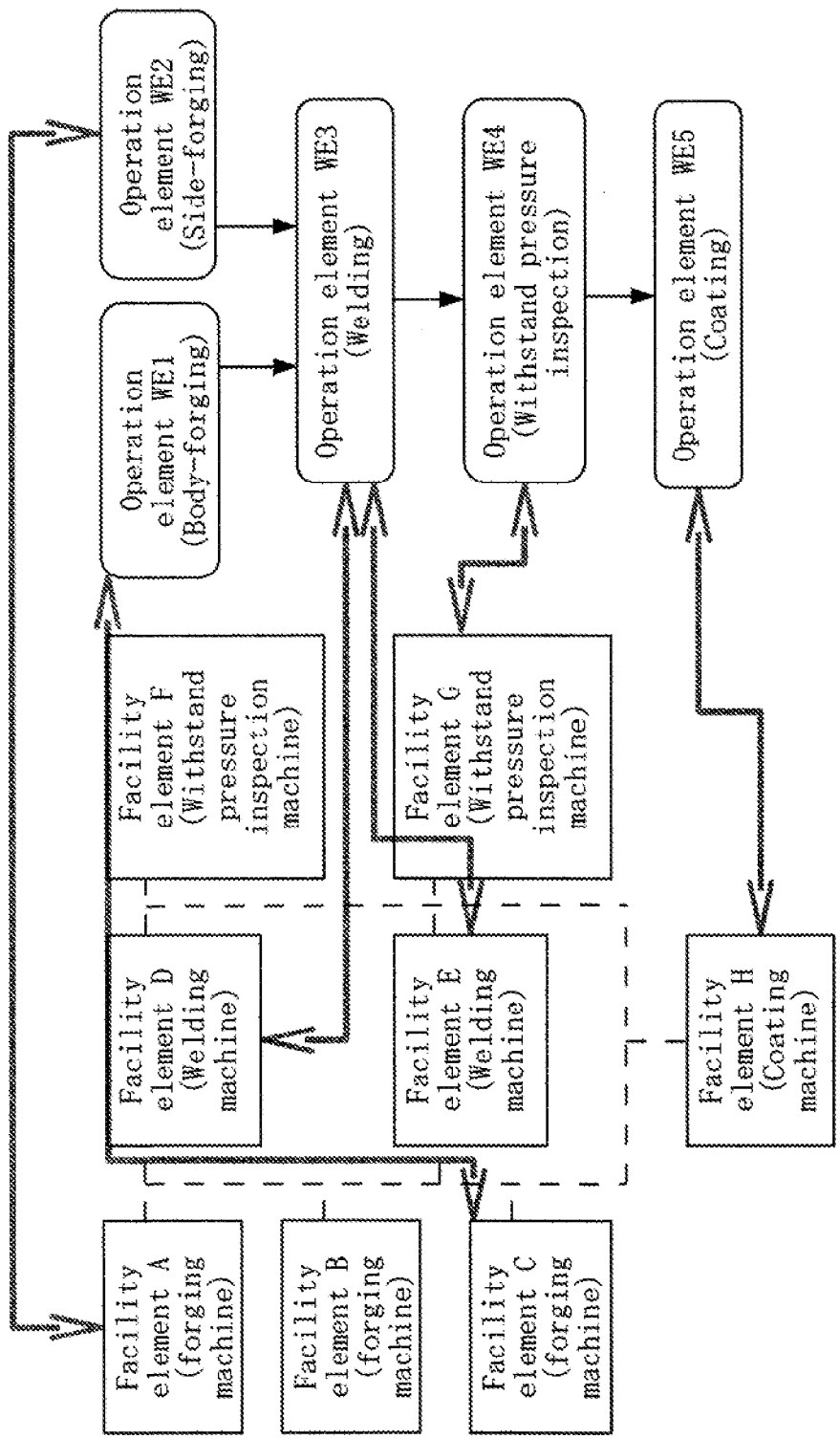
FIG. 7 is an illustrative diagram conceptually showing a link setting screen of the facility elements and the operation elements in the example.

As shown in the conceptual diagram of FIG. 7, the association of the facility elements and the operation elements described above is performed by, for example, selecting the facility elements in the screen where the facility elements are two-dimensionally arranged, selecting the operation elements in the screen where the operation elements forming the production process network are arranged as a network and executing a command for associating them or selecting the operation elements in the screen where the operation elements forming the production process network are arranged as a network and dragging and dropping the facility elements into the screen where the facility elements are two-dimensionally arranged.

The association of the facility elements and the operation elements and the link information can be set by using a plurality of facility elements and a plurality of operation elements. In this way, a certain operation element can be appropriately performed in a single or a plurality of facility elements according to the amount of production and variations in the production items and it is possible to cope with a change from the original facility element to another facility element, and a plurality of operation elements can be performed with one facility element by linking the one facility element to the plurality of operation elements. Since facility elements that are not utilized within the factory may be produced, facility elements that are not linked to operation elements may be present. However, the operation elements need to be performed without fail and thereby need to be linked to any facility elements.

As described above, the simulation computation of the production process is performed with the production system simulation device 1 in which the facility element information, the operation element information and the link information are set. In the simulation computation, according to the sufficiency of the development conditions of the operation elements individually linked to the facility elements by the link information, the components necessary for the facility elements are utilized to perform the production operation, the operation completion products that are, for example, processed or assembled as a result of the processing of the facility elements are output to the subsequent facility element which is the output destination after the completion of the operation of the operation elements and thus the computation processing is simulatively performed.

In this computation, for example, the components we2: the side portions (Side) that are forged by the facility element A (forging machine) are stored in the component buffer of the facility element D (welding machine), the component we1: the main body (Body) that is forged by the facility element C (forging machine) is stored in the component buffer of the facility element D (welding machine) or the element facility E (welding machine), at a time (time when the components we2: the two side portions and the component we1: the one main body are stored in the component buffer) when the development conditions of the facility element D (welding machine) or the element facility E (welding machine) are satisfied, the necessary components (the components we2: the two side portions and the component we1: the one main body) are consumed, the facility element D (welding machine) or the element facility E (welding machine) performs the operation (welding operation), the intermediate product (a component we3) to which the side portions (Side) and the main body (Body) are welded is generated, the intermediate product (the component we3, the generated product) is output to the facility element G (withstand pressure inspection machine) defined as the subsequent step and the computation processing is simulatively performed. When a plurality of facility elements are set in the same operation element, the development conditions of the facility elements are individually determined, and the facility element satisfying the development conditions is operated and output. The computation is performed such that the processing described above is performed in parallel by the facility elements, and thus it is possible to simulate the production.

Figure 8:
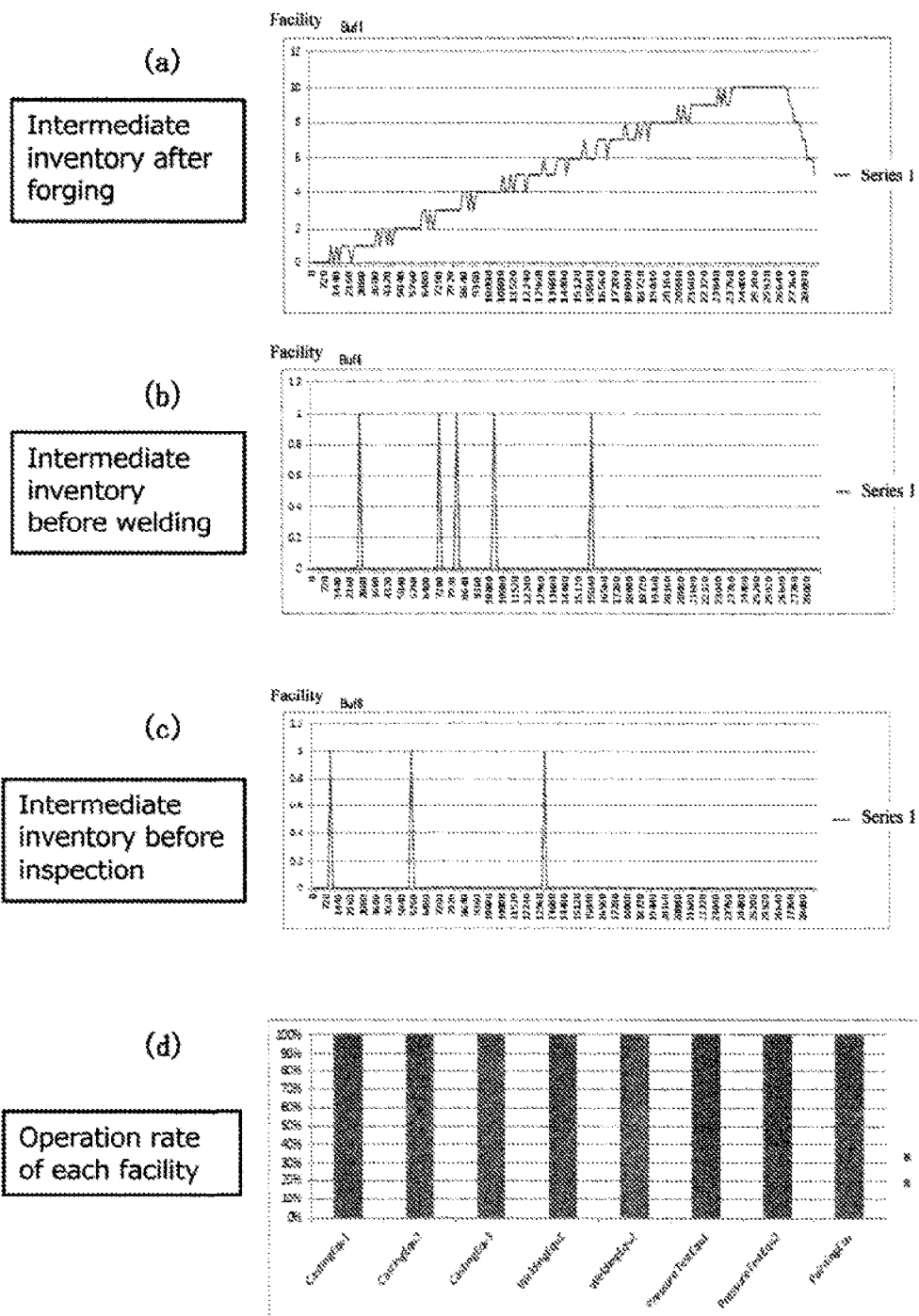
FIGS. 8(a) to 8(d) are illustrative diagrams showing an example where logs recorded in an operation log database are graphed.

The change of the state in each of the facility elements is recorded in the operation log database 36 according to the time such as the time elapsed since the start of the simulation, and thus various analyses can be performed. FIG. 8 shows a graph of the logs that are recorded in the operation log database. In this way, it is possible to grasp the number of components in the component buffer held by each of the facility elements with the passage of time, that is, the change in the intermediate inventory, the operation rate within the operation time of each of the facility elements, and the like. In the example described above, for example, the time when the components we2 (the side portions) forged in the facility element A (forging machine) are stored in the component buffer of the facility element D (welding machine) or the element facility E (welding machine), the time when the component we1 (the main body) forged in the facility element C (forging machine) is stored in the component buffer of the facility element D (welding machine) or the element facility E (welding machine), the time when the facility element D (welding machine) or the element facility E (welding machine) consumes the two components we2 (the side portions) and the one component we1 (the main body) to start the generation of the component we3 (intermediate product), the time when the facility element D (welding machine) or the element facility E (welding machine) completes the generation of the component we3 (intermediate product) and the like are recorded and stored in the operation log database 36 according to each of the states.

Preferably, in the production simulation by the production system simulation device 1 of the example described above, when the development conditions of the facility elements are satisfied, the simulation and computation are performed so as to perform the production operation. However, according to the production plan, in addition to the development conditions, additional conditions such as conditions of whether or not the production operation may be performed in each of the operation elements, conditions of activities (logistics, the organization of workers) or both of these may be added, and the additional conditions are stored in the operation element information storage portion 33, with the result that when the development conditions and the additional conditions are satisfied, the simulation and computation are performed such that the facility element linked to the operation element performs the operation.

For example, operational conditions of the production factory are added such as what products are produced, in what order the products are produced, how many products are individually produced, a production target as to in what quantity the products are produced, a production method, whether or not it is within working hours to perform the production, what time the production is started and a condition under which the production is performed within a range where the target production amount is not reached. Moreover, what time the components supplied from a subcontractor or another factory are delivered into the factory and how many components are delivered thereinto may be added. In this case, a mechanism is prepared in which, in the component buffer held by the facility elements, the components are generated according to the state of the delivery from a subcontractor or another factory. When the state of supply of the components from a subcontractor or another factory is desired to be prevented from being reflected in the early stages of the plan, a mechanism is preferably prepared in which, when the facility elements are needed in the component buffer that is the most upstream of the production process network, the components are supplied indefinitely.

As conditions regarding the organization of workers, the following is preferably added: for example, the number of workers per operation group is set, the facility element of which a certain operation group is in charge is also set, and thus when the workers of the operation group are available, they can perform an operation on the facility element. Such utilization is not limited to the form indicated in the present example and, for example, when an operation of transporting the components to the facility elements is set as the operation element, it is possible to realize additional conditions in which the workers of the operation group of the transportation can cope with the operation.

[Variation of Embodiment and the Like]

The invention disclosed in the present specification includes each invention, the embodiment, and, within an applicable range, an invention specified by changing a partial configuration thereof to another configuration of the disclosure of the present specification, an invention specified by adding another configuration of the disclosure of the present specification to the configuration thereof and an invention obtained by reducing, specifying and highly conceptualizing the partial configuration thereof as long as a partial effect is acquired. The following variations are also included.

For example, although the production system simulation device in the production process is used in the embodiment described above, the invention disclosed in the present specification includes an appropriate system simulation device in an operation process and, for example, a system simulation device or the like in a logistics process can also be used.

Figure 9:
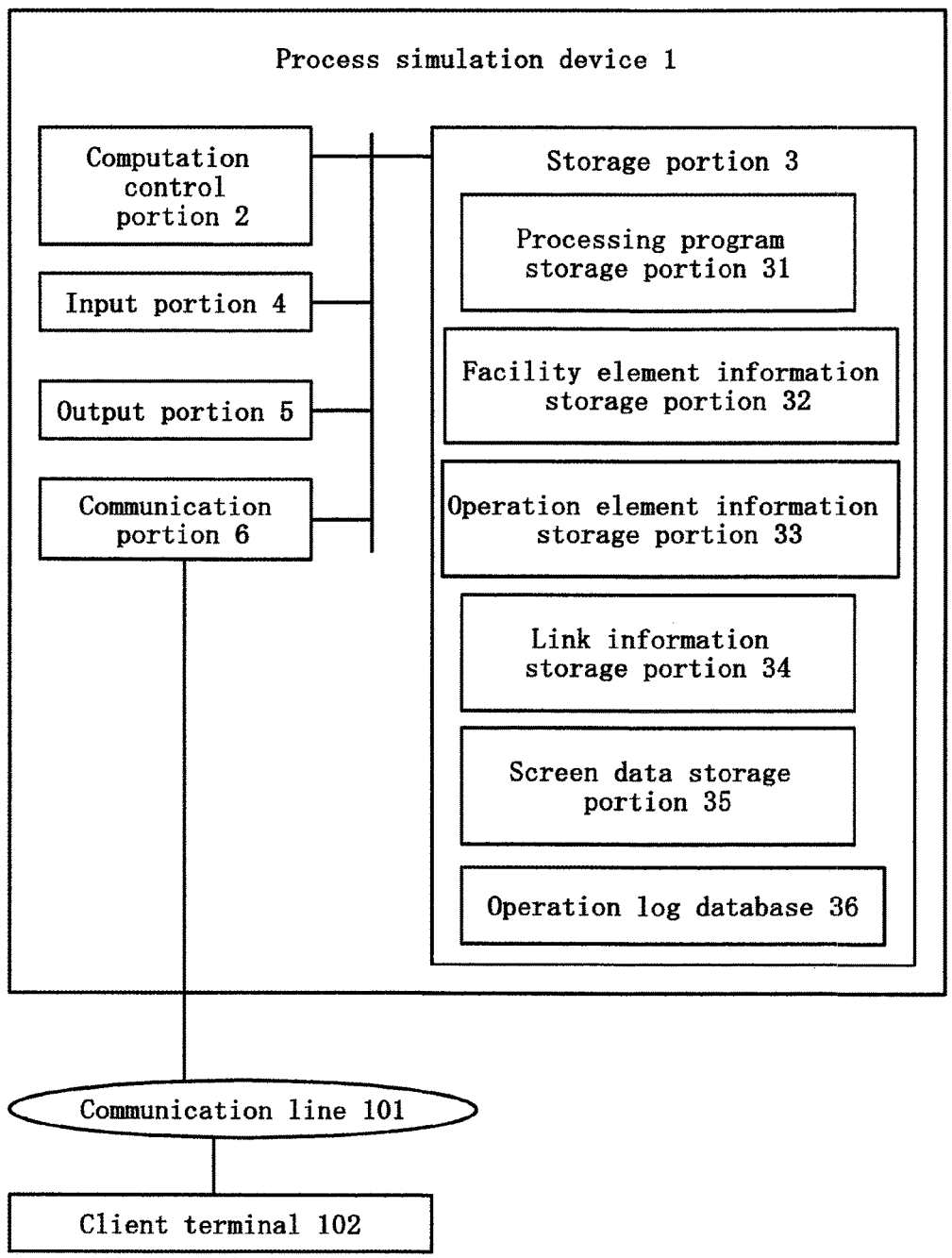
FIG. 9 is a block diagram showing the entire configuration of a production system simulation device and a client terminal in a variation.

It is possible to adopt a configuration in which, as shown in FIG. 9, a communication portion 6 that performs communication control is provided in the production system simulation device 1, and thus it is possible to communicate with a client terminal 102 through a communication line 101, the link information is set by transmission from the client terminal 102, and the client terminal 102 can receive the results of a simulation. The production system simulation device 1 can also indirectly perform transmission and reception with the client terminal 102 through a server or the like that is separately installed.

In this way, it is possible to submit the result of the simulation of the production system simulation device 1 to a user who is in another site such as a remote place, or the user can obtain the analysis of effects by the simulation of the production system simulation device 1 shared by a plurality of users only when it is needed, with the result that it is possible to efficiently utilize the production system simulation device 1 and to perform analysis of effects by the simulation at lower cost.

INDUSTRIAL APPLICABILITY

The present invention can be utilized, for example, when a process such as a production process or a logistics process is simulated to obtain an analysis of its effects.

REFERENCE SIGNS LIST

1: production system simulation device, 2: computation control portion, 3: storage portion, 31: processing program storage portion, 32: facility element information storage portion, 33: operation element information storage portion, 34: link information storage portion, 35: screen data storage portion, 36: operation log database, 4: input portion, 5: output portion, 6: communication portion, 101: communication line, 102: client terminal

The invention claimed is:

1. A production system simulation device that simulates state progress caused by a chain of phenomena generated discretely, the production system simulation device comprising:
a user interface setting facility element information, operation element information, and link information of facility elements and operation elements, the operation element information being set independently of the facility element information, the facility element information including various factors for the facility elements, the operation element information including development conditions of the operation elements and an output destination after completion of an operation;
a storage storing the facility element information, the operation element information, and the link information; and
a processor accessing the facility element information, the operation element information, and the link information from the storage and being configured to perform a simulation processing according to the development conditions of the operation element information of a first operation element linked by the link information to at least a first facility element, the first facility element simulatively performing the operation, an output of the operation is simulatively output to the output destination after completion of the operation in the operation element information of the first operation element,
wherein the various factors for the facility elements includes
position information of the facility elements,
a transport time from the first facility element to a second facility element that is acquired based on position information of the first facility element and position information of the second facility element as an output destination of the first facility element, and
at a time when the transport time has elapsed since an operation completion time of the first facility element, an intermediate product after the completion of the operation of the first facility element that is simulatively output to the second facility element.

2. The production system simulation device according to claim 1,
wherein the development conditions of the operation element information of the first operation element includes types and numbers of components, the first facility element linked to the first operation element simulatively generates a generated product so as to consume the components, and types and numbers of the generated product are simulatively output to the output destination, and
when in addition to a standard cycle time set as the operation element information of the first operation element, a cycle time is set via the user interface as the facility element information of the first facility element, an operation of generating the generated product is simulatively performed with the cycle time of the facility element information.

3. The production system simulation device according to claim 2, wherein a result of the simulation is transmitted to a client terminal through a communication line either directly or indirectly.

4. A client terminal that receives a result of simulation from the production system simulation device of claim 3 through a communication line either directly or indirectly.

5. The production system simulation device according to claim 1, wherein a result of the simulation is transmitted to a client terminal through a communication line either directly or indirectly.

6. A client terminal that receives a result of simulation from the production system simulation device of claim 5 through a communication line either directly or indirectly.

7. A production system simulation device that simulates state progress caused by a chain of phenomena generated discretely, the production system simulation
device comprising:
a user interface setting facility element information, operation element information, and link information of facility elements and operation elements, the operation element information being set independently of the facility element information, the facility element information including various factors for the facility elements, the operation element information including development conditions of the operation elements and an output destination after completion of an operation;

a storage storing the facility element information, the operation element information, and the link information; and a processor accessing the facility element information, the operation element information, and the link information from the storage and being configured to perform a simulation processing according to the development conditions of the operation element information of a first operation element linked by the link information to at least a first facility element, the first facility element simulatively performing the operation, an output of the operation is simulatively output to the output destination after completion of the operation in the operation element information of the first operation element, wherein as the development conditions of the operation element information of the first operation element, types and numbers of components are set via the user interface, the first facility element linked to the first operation element simulatively generates a generated product so as to consume the components, and types and numbers of the generated product are simulatively output to the output destination, and when in addition to a standard cycle time set as the operation element information of the first operation element, a cycle time is set via the user interface as the facility element information of the first facility element, an operation of generating the generated product is simulatively performed with the cycle time of the facility element information.

8. The production system simulation device according to claim 7, wherein a result of the simulation is transmitted to a client terminal through a communication line either directly or indirectly.

9. A client terminal that receives a result of simulation from the production system simulation device of claim 8 through a communication line either directly or indirectly.

10. A production system simulation method that simulates state progress caused by a chain of phenomena generated discretely, the production system simulation method comprising the steps of:

setting, by a user interface, facility element information, operation element information, and link information of facility elements and operation elements, the operation element information being set independently of the facility element information, the facility element information including various factors for the facility elements, the operation element information including development conditions of the operation elements and an output destination after completion of an operation;

storing the facility element information, the operation element information, and the link information into a storage; and accessing, by a processor, the facility element information, the operation element information, and the link information from the storage and performing a simulation processing according to the development conditions of the operation element information of a first operation element linked by the link information to at least a first facility element, the first facility element simulatively performing the operation, an output of the operation is simulatively output to the output destination after completion of the operation in the operation element information of the first operation element, wherein the various factors for the facility elements includes position information of the facility elements, a transport time from the first facility element to a second facility element that is acquired based on position information of the first facility element and position information of the second facility element as an output destination of the first facility element, and at a time when the transport time has elapsed since an operation completion time of the first facility element, an intermediate product after the completion of the operation of the first facility element that is simulatively output to the second facility element.

11. A non-transitory computer readable medium storing a program to simulate state progress caused by a chain of phenomena generated discretely, the program causing a processor to execute a method comprising the steps of:

setting, by a user interface, facility element information, operation element information, and link information of facility elements and operation elements, the operation element information being set independently of the facility element information, the facility element information including various factors for the facility elements, the operation element information including development conditions of the operation elements and an output destination after completion of an operation;

storing the facility element information, the operation element information, and the link information into a storage; and accessing, by the processor, the facility element information, the operation element information, and the link information from the storage and performing a simulation processing according to the development conditions of the operation element information of a first operation element linked by the link information to at least a first facility element, the first facility element simulatively performing the operation, an output of the operation is simulatively output to the output destination after completion of the operation in the operation element information of the first operation element, wherein the various factors for the facility elements includes position information of the facility elements, a transport time from the first facility element to a second facility element that is acquired based on position information of the first facility element and position information of the second facility element as an output destination of the first facility element, and at a time when the transport time has elapsed since an operation completion time of the first facility element, an intermediate product after the completion of the operation of the first facility element that is simulatively output to the second facility element.

12. A production system simulation method that simulates state progress caused by a chain of phenomena generated discretely, the production system simulation method comprising the steps of:

setting, by a user interface, facility element information, operation element information, and link information of facility elements and operation elements, the operation element information being set independently of the facility element information, the facility element information including various factors for the facility elements, the operation element information including development conditions of the operation elements and an output destination after completion of an operation;

storing into a storage the facility element information, the operation element information, and the link information; and accessing, by a processor, the facility element information, the operation element information, and the link information from the storage and performing a simulation processing according to the development conditions of the operation element information of a first operation element linked by the link information to at least a first facility element, the first facility element simulatively performing the operation, an output of the operation is simulatively output to the output destination after completion of the operation in the operation element information of the first operation element, wherein as the development conditions of the operation element information of the first operation element, types and numbers of components are set by the user interface, the first facility element linked to the first operation element simulatively generates a generated product so as to consume the components, and types and numbers of the generated product are simulatively output to the output destination, and when in addition to a standard cycle time set as the operation element information of the first operation element, a cycle time is set by the user interface as the facility element information of the first facility element, an operation of generating the generated product is simulatively performed with the cycle time of the facility element information.

13. A non-transitory computer readable medium storing a program to simulate state progress caused by a chain of phenomena generated discretely, the program causing a processor to execute a method comprising the steps of:

setting, by a user interface, facility element information, operation element information, and link information of facility elements and operation elements, the operation element information being set independently of the facility element information, the facility element information including various factors for the facility elements, the operation element information including development conditions of the operation elements and an output destination after completion of an operation;

storing into a storage the facility element information, the operation element information, and the link information; and accessing, by a processor, the facility element information, the operation element information, and the link information from the storage and performing a simulation processing according to the development conditions of the operation element information of a first operation element linked by the link information to at least a first facility element, the first facility element simulatively performing the operation, an output of the operation is simulatively output to the output destination after completion of the operation in the operation element information of the first operation element, wherein as the development conditions of the operation element information of the first operation element, types and numbers of components are set by the user interface, the first facility element linked to the first operation element simulatively generates a generated product so as to consume the components, and types and numbers of the generated product are simulatively output to the output destination, and when in addition to a standard cycle time set as the operation element information of the first operation element, a cycle time is set by the user interface as the facility element information of the first facility element, an operation of generating the generated product is simulatively performed with the cycle time of the facility element information.

\* \* \* \* \*